United States Patent [19]

Sauer

[11] Patent Number: 4,509,181

[45] Date of Patent: Apr. 2, 1985

[54] CCD CHARGE SUBSTRACTION ARRANGEMENT

[75] Inventor: Donald J. Sauer, Plainsboro, N.J.

[73] Assignee: RCA Corporation, New York, N.Y.

[21] Appl. No.: 383,302

[22] Filed: May 28, 1982

[51] Int. Cl.[3] .................. G11C 19/28; H03H 7/30
[52] U.S. Cl. .................................. 377/63; 377/60;
377/61; 357/24; 358/31; 333/165
[58] Field of Search .................... 377/61, 63, 60;
333/165; 357/24; 358/31

[56] References Cited

U.S. PATENT DOCUMENTS

| | | | |
|---|---|---|---|
| 4,090,095 | 5/1978 | Herrmann | 377/60 |
| 4,096,516 | 6/1978 | Pritchard | 358/31 |
| 4,123,733 | 10/1978 | Poirer | 333/165 |
| 4,139,784 | 2/1979 | Sauer | 377/57 |
| 4,255,725 | 3/1981 | Berger et al. | 333/165 |
| 4,337,403 | 6/1982 | Berger et al. | 377/61 |

*Primary Examiner*—John S. Heyman
*Attorney, Agent, or Firm*—Eugene M. Whitacre; Peter M. Emanuel; Lawrence C. Edelman

[57] ABSTRACT

Charge subtraction for charge packets of two charge transfer device (CTD) delay lines is provided by alternately transferring them under a periodically clamped, normally floating sense gate, common to both delay lines. Adjacent the sense electrode, each delay line includes preceding and succeeding transfer gates, the gates of each line clocked by one of first and second oppositely phased clock signals for alternately transferring the charge packets under the sense gate. A reset switch clamps the sense gate to a reference voltage whenever its input voltage exceeds a first threshold level and unclamps the gate whenever its input voltage falls below the first threshold level.

The clock signal applied to the gates of one of the delay lines is also applied to the input of the reset switch and includes an amplitude excursion which sequentially falls below the first threshold level which unclamps the sense gate and then falls below a second threshold level which causes a charge packet from the preceding gate of that one line to transfer in under the sense gate. Since a single amplitude transition of one of the clock signals includes both the threshold levels for performing these functions, the time delay between these functions is minimized. The second, oppositely phased clock signal, is applied to the other of the two delay lines and includes an amplitude excursion which increases above a third threshold level for causing a charge packet to transfer out from under the sense gate into the succeeding gate at a time after the first clock signal has fallen below the second threshold level. This results in a minimum amount of time for causing charge packet transfer under the sense gate while it is unclamped and provides a maximum amount of time for accurately sampling the subtractive combination of the charge packets sensed by the sense gate.

4 Claims, 6 Drawing Figures

CCD CHARGE SUBSTRACTION ARRANGEMENT

The present invention relates to charge coupled device (CCD) delay lines, and in particular to the use of an arrangement for performing charge subtraction within the CCD structure. One of the applications for CCD delay lines has been for use in comb filter arrangements for separating the luminance and chrominance components of a composite television broadcast signal. In U.S. patent application Ser. No. (383,301) concurrently filed with this one in my name and that of D. H. Pritchard a CCD delay line comb filter signal separation arrangement is described including a floating gate subtractor arrangement. Typically, CCD floating gate subtractor arrangements require the use of a clamp signal, $\phi_{reset}$, which must be properly timed with respect to the clock signals applied to the gates adjacent the floating gate in order to clamp the floating gate to a reference voltage when the charge of one delay line is under the floating gate and a charge from the other delay line is under a gate preceding the floating gate. Furthermore, the floating electrode must be unclamped when the charge from the other delay line is under the floating gate and the charge from the first delay line, which was under the floating gate when clamped, is under a succeeding gate.

It is desirable to eliminate the need for a separate $\phi_{reset}$ signal to control the clamping of the floating gate. Furthermore, it is desirable to better coordinate the clamping of the floating electrode and the clocking of the CCD delay line gates in order to minimize the transfer time under the floating gate and maximize the time duration when the subtractive charge combination can be sensed.

In accordance with the principles of the present invention, apparatus for subtracting a first signal from a second signal includes first and second charge transfer channels formed on a substrate, each channel including a plurality of gates overlying the channels for storing and transferring charge packets representative of the first and second signals, respectively, therein. First and second oppositely phased clock signals are applied to the gates overlying the first and second channels, respectively. Each clock signal initiates storage of charge packets under the clocked gates when its amplitude transgresses a first threshold level and initiates transfer of charge packets out from beneath the clocked gates when its amplitude transgresses a second threshold level.

A floating gate overlies both the first and second channels between preceding and succeeding gates of the channels and is periodically clamped to a reference potential when the amplitude level of a clamp signal transgresses a third threshold level. The second clock signal is applied to the floating gate as the clamp signal, and includes an amplitude excursion which sequentially transgresses the third threshold level for unclamping the floating gate and then transgresses the second threshold level for initiating the transfer of a charge packet in the second channel out from under a preceding gate and in under the floating gate. Since a single amplitude excursion of the clock signal includes the threshold levels for performing both these operations, they are "self-timed" with respect to each other and occur with a minimum of time delay therebetween.

The first clock signal includes an amplitude excursion which transgresses the first threshold level at a time after the second clock signal transgresses the second threshold level for initiating the storage of a charge packet under the succeeding gate of the first channel. This minimizes the time delay between charge packet transfer under the floating gate and thus maximizes the time period when the subtractive combination of the charge packets sensed by the floating gate can be sampled.

Figure 1:
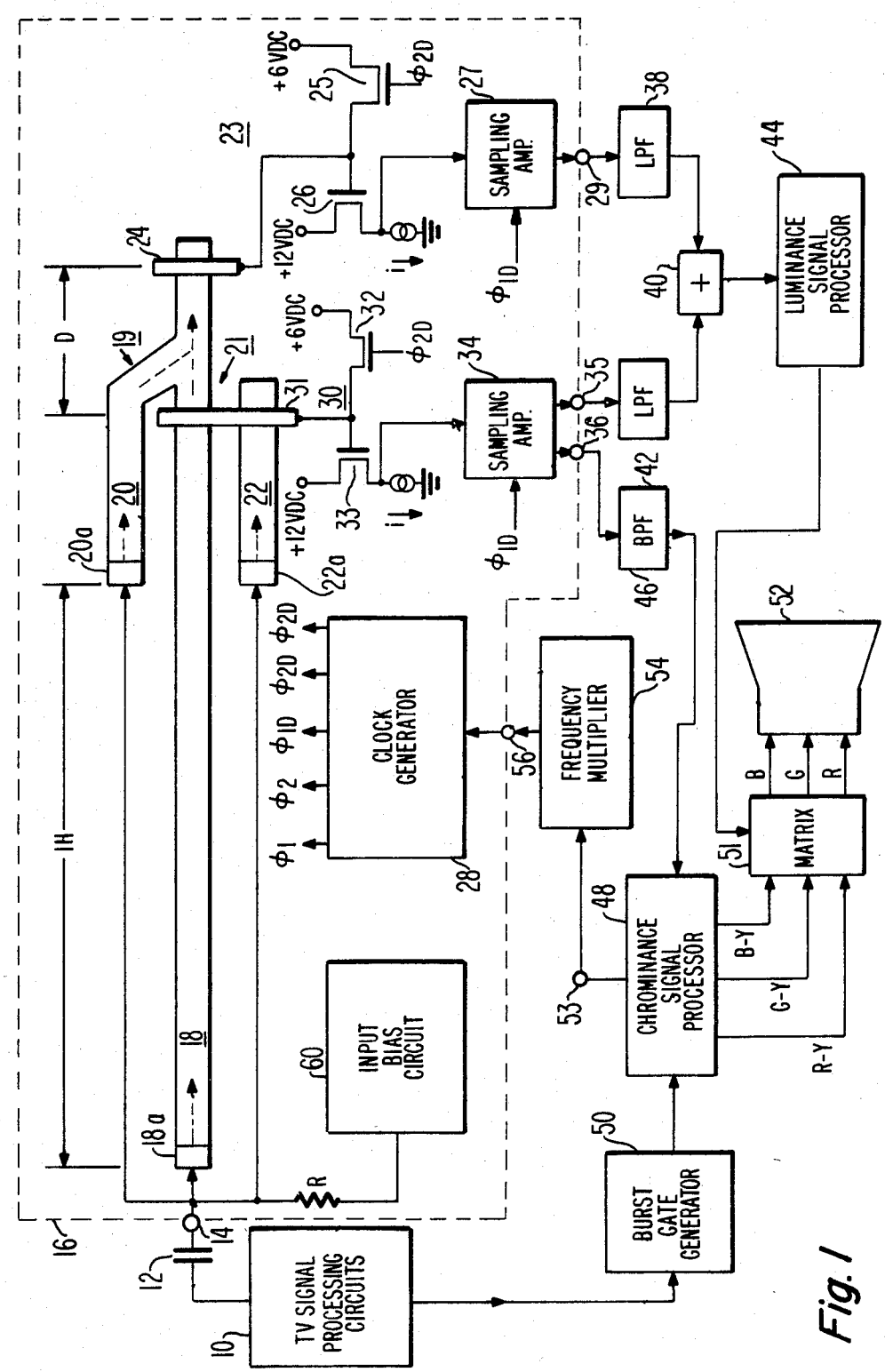
FIGS. 1 and 1a illustrate, partially in block diagram and partially in schematic diagram form, a CCD comb filter arrangement constructed in accordance with principles of the present invention.
Figure 2:
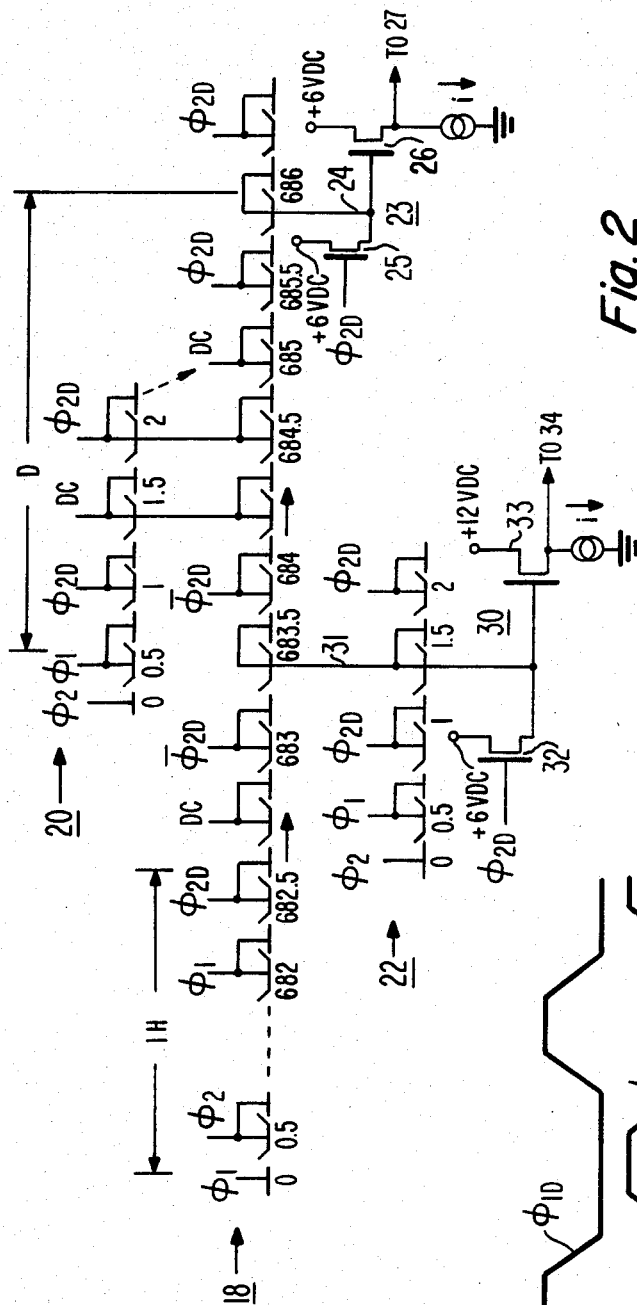
FIG. 2 illustrates in schematic diagram form the electrode structure of a portion of the CCD arrangement of FIG. 1.

FIGS. 4a to 4f illustrate potential well diagrams useful for explaining the operation of a portion of the CCD arrangements of FIGS. 1 and 2; and FIGS. 5a through 5h illustrate potential well diagrams and waveforms useful in explaining the operation of the floating gate subtractor portion of the CCD arrangements of FIGS. 1 and 2;

Now referring to FIG. 1, a TV signal processing circuit 10, which includes, for example, conventional radio frequency and intermediate frequency stages and a video detector is shown for generating a composite color television video signal including frequency interleaved luminance and chrominance signal components. The composite color video signal is AC coupled via a capacitor 12 to a terminal 14 of a comb filter signal processing arrangement 16, shown enclosed by a dashed line. The dashed line includes circuit components which may be fabricated on a single monolithic integrated circuit of, for example, the N-MOS type.

The composite video signal from terminal 14 is coupled in parallel to input sections 18a and 20a of a luminance signal comb filter, including a long CCD delay line 18 and a short CCD delay line 20; and to inputs 18a and 22a of a chrominance signal comb filter, including long delay line 18 and another short CCD delay line 22.

Delay lines 18, 20 and 22 are preferably N-type buried-channel CCD delay lines utilizing first and second layers of gate electrodes to obtain asymmetrical potential wells in the underlying substrate, for permitting unidirectional charge propagation in the direction indicated by dashed arrows when clocked by oppositely phased (biphase) clock signals. Details of the CCD delay line structure and charge propagation will be discussed with respect to FIGS. 2 through 4.

Delay lines 18 and 20 are arranged to obtain a difference in signal delay precisely equal to one horizontal scanning line (a 1H delay which equals 63.55 microseconds) between samples of the composite video signals applied in parallel to the inputs of the delay lines from terminal 14. The buried channels of delay lines 18 and 20 are physically combined at a delay line section 19 having commonly clocked electrodes (e.g., the channel stop separating the channels within the substrate of the integrated circuit is removed and the channels merge together) resulting in additive combination of the 1H relatively delayed video signals which produces a combed luminance signal.

At the point of merger, the difference in signal delay provided between lines 18 and 20 is determined by the CCD clock frequency and the difference in the number of stages the signal is clocked through within each of the CCD delay lines.

The illustrative embodiment is for the NTSC system and uses a clock frequency of three times the clock subcarrier frequency (i.e., $3 \times 3.58$ MHz=10.7 MHz). This frequency is chosen first, to comply with the Nyquist criterion related to sampled data systems which requires that a sampling rate must be at least twice the highest frequency which is to be sampled and secondly, to provide a desired stability and power consumption for the clock signal generating circuits.

It should be noted that since the clock frequency is an odd multiple (3) of the color subcarrier frequency, it is also an odd multiple of one-half the line scanning frequency $f_H$ (i.e., 10.7 MHz=$f_H \times 1365/2$). When using such a clock frequency, a fractional number of stages correspond to a signal delay of precisely 1H (i.e., 63.55 microseconds corresponds to $682\frac{1}{2}$ stages clocked at 10.7 MHz).

When sampling a signal in response to a particular phase of a clock signal, samples only exist at time periods separated by integer multiples of the clock signal period. Thus, if it is desired to combine two signals which have a relative delay therebetween corresponding to a fractional number of CCD delay line stages, it will be appreciated by those skilled in the art, that two CCD delay lines are required. Each delay line including an unequal number of stages and clocked under different phases of the clock signal in order that, at their outputs, charge packets of an applied input signal have a relative delay therebetween corresponding to the fractional number of stages. A preferred manner of providing this 1H relative delay is described with respect to FIG. 2.

Referring again to FIG. 1, the combed luminance signal is extracted out from comb filter section 19 by a sensing circuit 23 including floating electrode 24, reset switch 25 and source follower 26. Floating electrode 24 physically overlays section 19 and, in conjunction with reset switch 25 and source follower 26 non-destructively senses the combed luminance signal (to be described in detail later on) and applies it to the input of a sample and hold amplifier 27. Amplifier 27, in response to a sampling signal $\phi_{1D}$ from a clock generator 28, samples the combed luminance signal and provides an amplified version of the combed luminance signal to terminal 29.

Delay lines 18 and 22 are also arranged to maintain a difference in signal delay precisely equal to 1H between samples of the composite video signal applied in parallel to the input of the delay lines from terminal 14. A combed chrominance signal is developed in a comb filter section 21, including a portion of delay lines 18 and 22, and sensed by a sensing circuit 30 including a floating electrode 31, a reset switch 32 and a source follower 33. Floating electrode 31 physically overlays a portion of delay lines 18 and 22 and, in conjunction with reset switch 32 and source follower 33 (as will be described later on with respect to FIGS. 2–5) senses the subtractive combination of the 1H relatively delayed samples of the video signal applied to the input of delay lines 18 and 22 to produce a combed chrominance signal. The combed chrominance signal is applied via source follower 33 to the input of a sample and hold amplifier 34. Sample and hold amplifier 34 is responsive to the sampling signal $\phi_{1D}$ from clock generator 28 for sampling the combed chrominance signal and includes an amplifier arrangement for providing individually buffered and amplified combed chrominance signals to terminals 35 and 36.

A low-pass filter (LPF) 38, coupled to terminal 29, has an amplitude versus frequency characteristic with an upper frequency cutoff of, for example, 4.0 MHz, suitable for passing a wideband version of the combed luminance signal to one input of a signal combiner 40 while rejecting the higher frequency clocking signals of the delay lines. A low-pass filter (LPF) 42, coupled to terminal 35, has an amplitude versus frequency characteristic with a cutoff frequency of, for example, 1.5 MHz suitable for passing relatively low frequency (vertical detail) information of the combed chrominance output signal while rejecting the relatively higher frequency chrominance information and delay line clocking signals. Low-pass filter 42 supplies a vertical detail information signal to a second input of combiner 40. A "restored" luminance signal is generated at the output of combiner 40. This "restored" luminance signal is applied to a luminance signal processor 44 for further amplification and processing.

A bandpass filter (BPF) 46 coupled to terminal 36 has an amplitude versus frequency passband response characteristic centered at the color subcarrier frequency, e.g., at least $\pm 500$ kHz from 3.58 MHz for the NTSC system, which is suitable fo passing the chrominance signal component of the combed chrominance signal while rejecting the lower frequency luminance component and higher frequency delay line clocking signals. Bandpass filter 46 supplies the chrominance signal to a chrominance signal processor 48. Chrominance signal processor 48 is also supplied with a color burst gating signal derived from the horizontal synchronization signals by a burst gate generator 50.

Chrominance signal processor 48 includes a conventional chrominance subcarrier extractor (not shown) for deriving a color reference signal locked in frequency and phase to the color burst signal which occurs during the color burst gating signal. The color reference signal is used to demodulate the combed chrominance signal to produce color difference signals R-Y, G-Y and B-Y, which are applied to a matrix circuit 51. Matrix circuit 51 also receives the "restored" luminance signal from processor 55 and supplies R, G and B primary color representative signals to kinescope 52. Luminance signal processor 44, burst gate generator 50 and matrix circuit 51 are well known in the television arts and therefore will not be described in detail.

It is noted that electrode 24, which senses the combed luminance signal, is located at a point corresponding to a time delay D, with respect to the direction of signal propagation, from electrode 31 which senses the combed chrominance signal. The time delay D serves to delay the combed luminance signal by a sufficient amount so that the chrominance and luminance components are properly time coordinated at the inputs of matrix 51. In this embodiment, the delay D primarily serves to compensate for chrominance signal delay due to the chrominance band pass filter 46. The delay D, provided within the CCD comb filter arrangement eliminates the need for a conventional discrete luminance delay equalization network (e.g., which may be included in luminance processor 44) for equalizing the luminance and chrominance signal transition times prior to being combined in matrix 51.

In addition, the color reference signal (at 3.58 MHz for the NTSC system) generated within chrominance signal processor 48 is supplied via a terminal 53 to a color subcarrier frequency multiplier (tripler) circuit 54. A suitable multiplier circuit is described in a U.S. Pat. No. 4,325,076 issued Apr. 13, 1982. Clock generator 28 receives the output signal from multiplier circuit 54 having a frequency of 3×3.58 MHz=10.7 MHz via terminal 56 and develops CCD clock signals $\phi_1$, $\phi_2$, $\phi_{1D}$ $\phi_{2D}$ and $\phi_{2d}$ (shown in FIG. 3) for application to delay lines 18, 20 and 22 to effect charge transfer therein. The application of the clock signals to delay lines 18, 20 and 22 in the vicinity of sensing electrodes 24 and 31 is described with respect to FIG. 2.

An input bias circuit 60, coupled to terminal 14 via a resistor R, is employed to control the direct voltage bias at the input section (not shown) of CCD delay lines 18, 20 and 22, and may be constructed as described in U.S. Pat. No. 4,139,784 issued Feb. 13, 1979 to D. J. Sauer.

In general the construction and operation of the above described FIG. 1 comb filter signal processing circuit is substantially the ame as the comb filter signal processing arrangement described in U.S. Pat. No. 4,096,516 issued to D. H. Pritchard on June 20, 1978. However, in that patent a unity gain signal inverter is required to invert the signal at the input of one of the short delay lines in order that the subsequent charge combination results in a subtractive combination of the 1H relatively delayed signals. As noted earlier it is undesirable to use a signal inverter in the comb filter arrangement because it introduces an envelope delay and an amplitude mismatch between the corresponding signals processed in the long and short delay lines which degrades the signal cancellation performance of the comb filter arrangement. Additionally, the signal inverter provides an input signal to one of the short delay lines which may have a different DC characteristic than the input signal to the other delay line, thus necessitating the use of an additional DC input bias circuit.

In the present apparatus a unity gain signal inverter is not required in order that the comb filter arrangement provide a subtractive combination between the long and short delay lines 18 and 22. Sensing circuit 30, including floating electrode 31, operates as a floating gate subtractor for providing the subtractive combination of the signals in delay lines 18 and 22. The floating gate subtractor used in a CCD comb filter arrangement is advantageous in that it eliminates the need for a unity gain phase inverter for producing an inverted video signal for short delay line 22. Also, since the video signal developed at terminal 14 is directly coupled to each of the inputs of delay lines 18, 20 and 22, the need for a separate input bias circuit for controlling the DC bias for the input of short delay line 22 is avoided. Furthermore, the elimination of the phase inverter greatly improves the phase and amplitude matching between the transferred charges of the individual CCD delay lines resulting in maximum signal cancellation and reinforcement for the luminance and chrominance comb filter arrangement. Additionally, the amplitude and phase delay of an inverter, which are not consistent characteristics from device to device, do not have to be accounted for.

FIG. 2 shows in schematic diagram form the electrode gate structure which overlies the N-type buried channel for each of delay lines 18, 20 and 22, in the vicinity of sense electrodes 24 and 31. The electrodes shown with upcurved ends represent the transfer electrodes, and the straight electrodes represent the storage electrodes. During device fabrication, the CCD channel region under the transfer electrode is provided with a barrier potential relative to the channel region under the storage electrode by means such as ion-implanted barriers, which are well known in the art. This known type of asymmetrical electrode structure results in unidirectional charge propagation from left to right in the arrangements shown in FIGS. 1 and 2 when clocked by two complementary phase (biphase) signals. Adjacent transfer and storage electrodes are paired and clocked by the same clock signal form gates, alternate gates transferring and storing a charge packet in response to one of the biphase clock signals. Thus, each gate provides a delay corresponding to one half of the period of the 10.7 MHz clock signal. The numbers under each gate represent the cumulative delay at that point.

Figure 1A:
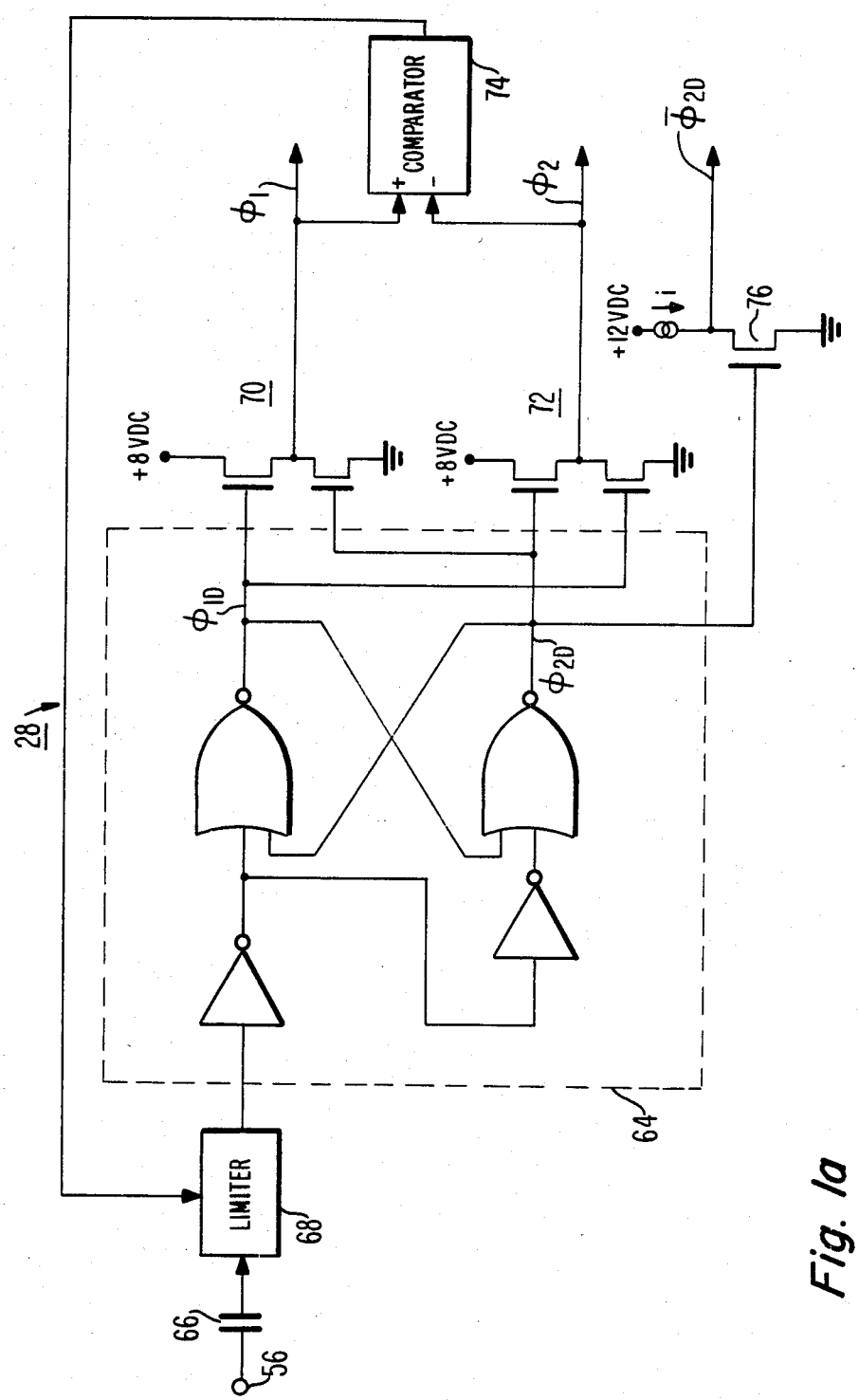
Figure 3:
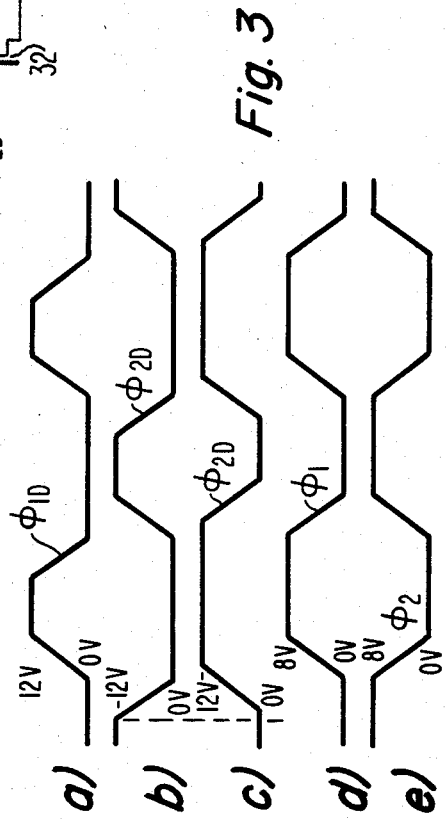
FIG. 3 illustrates the clock signal waveforms for the CCD arrangements of FIGS. 1 and 2.

Clock generator 28 generates $\phi_1$, $\phi_2$, $\phi_{1D}$, $\phi_{2D}$ and $\overline{\phi}_{2D}$ (the complement of $\phi_{2D}$) clock signals, shown in FIG. 3, which are applied to the electrode pairs of the gates shown in FIG. 2. As shown in FIG. 1a, clock generator 28 may be constructed using a NOR-gate flip-flop 64 which generates the $\phi_{1D}$ and $\phi_{2D}$ clock signals (FIGS. 3a and 3b) in response to the output signal of frequency multiplier 54 of FIG. 1 which is AC coupled to flip-flop circuit 64 via a capacitor 66 and an input limiter 68. The $\phi_{1D}$ and $\phi_{2D}$ clock signals are coupled to respective inputs of a pair of push-pull circuits 70 and 72, each comprising two FET's of the same conductivity type and having their conduction channels connected in series and driven in a complementary manner for generating at the junction between the FET's of each pair 70 and 72 symmetrical complementary phase clock signals $\phi_1$ and $\phi_2$ (FIGS. 3d and 3e). The push-pull circuits 70 and 72 are powered by an operating voltage source of lower DC potential than the NOR flip-flop circuit 64, resulting in an amplitude level for the $\phi_1$ and $\phi_2$ clock signals which is lower than the amplitude level for the $\phi_{1D}$ and $\phi_{2D}$ clock signals (e.g., 8 volts versus 12 volts). The DC level of the input at limiter 68 relative to its switching threshold determines the clock signal duty cycle and is set by the output signal of phase comparator 74, which is responsive to the $\phi_1$ and $\phi_2$ clock signals. The $\phi_{2D}$ clock signal is also applied to an FET inverter 76 for generating the $\overline{\phi}_{2D}$ clock signal (FIG. 3c).

It is recognized by those skilled in the art that the potential difference between the clock signals applied to adjacent gates must be sufficiently greater than the barrier potential to enable efficient charge transfer within the CCD delay lines. Illustratively, delay lines 18, 20 and 22 are fabricated with a barrier potential of approximately 4 volts. Due to process related factors, a 6 volt minimum potential difference is required between adjacent gates to provide satisfactory charge propagation. The DC amplitude level of the $\phi_1$ and $\phi_2$ clock signals are illustratively 8 volts. This is slightly greater than the minimum DC potential (i.e., 6 volts) sufficient to provide satisfactory charge propagation within each of the CCD delay lines. Since delay line 18 is a substantial portion of the comb filter signal processing arrangement 16 (682 stages), the amplitude of its clock signals ($\phi_1$ and $\phi_2$) are kept close to this minimum acceptable level in order to minimize circuit power requirements. The DC amplitude levels of the $\phi_{1D}$ $\phi_{2D}$ and $\overline{\phi}_{2D}$ clock signals are illustratively 12 volts DC. This voltage is greater than a substantially constant DC voltage (e.g., 6 volts) by an amount corresponding to the 6 volt minimum potential difference required for satisfactory charge transfer, thus providing satisfactory charge propagation within uniphase clocked portions of CCD delay lines 18, 20 and 22, as next described.

Referring to FIG. 2, delay lines 18, 20 and 22 begin with an input gate structure (referred to as 18a, 20a and 22a in FIG. 1 but not shown in FIG. 2) coupled in parallel to terminal 14 suitable for transferring into the delay lines charge packets representative of the composite video signal, in accordance with the well known "fill and spill" technique, such as described in the forementioned U.S. Pat. No. 4,139,784.

After the input section, each of delay lines 18, 20 and 22 and biphase clocked using the $\emptyset_1$ and $\emptyset_2$ clock signals and, in the vicinity of floating electrodes 24 and 31, are converted to uniphase clock operation in order to facilitate signal combination, as will be described below. In uniphase clock operation only alternate gates are clocked; the adjacent gates being held at a substantially constant DC voltage level intermediate the DC voltage excursions of the clock signals applied to the clocked gates in order that the applied potential difference between the gates is at least the minimum voltage required for satisfactory charge prapogation.

Delay line 18 is biphase clocked up to gate 683 and starts with a $\emptyset_1$ clock at gate 0 and continues in an alternating pattern of $\emptyset_1$ and $\emptyset_2$ clocking until gate 682. Gates 682.5 and 683 have the $\emptyset_{2D}$ and $\overline{\emptyset}_{2D}$ clock signals, respectively, applied. Between gates 683 and 684, in the vicinity of floating electrode 31, delay line 18 is clocked in a uniphase manner with $\overline{\emptyset}_{2D}$. After gate 684, in the vicinity of floating electrode 24, delay line 18 is clocked in a uniphase manner with $\emptyset_{2D}$.

Delay lines 20 and 22 start with biphase clocking, with a $\emptyset_2$ clock signal applied at gate 0. However, after gates 0.5 they are uniphase clocked with $\emptyset_{2D}$. Note also that gate 682.5 of delay line 18 is clocked with $\emptyset_{2D}$ which is of substantially the same phase as the $\emptyset_2$ clock signal applied to gate 0 of delay lines 20 and 22. This results in precisely 682.5 additional gates which the charge packets of the video signal must be clocked through within delay line 18 as compared with delay lines 20 and 22. As previously noted, these additional gates provide precisely 1H of differential delay between delay lines 18 and 20, 22.

Figure 4:
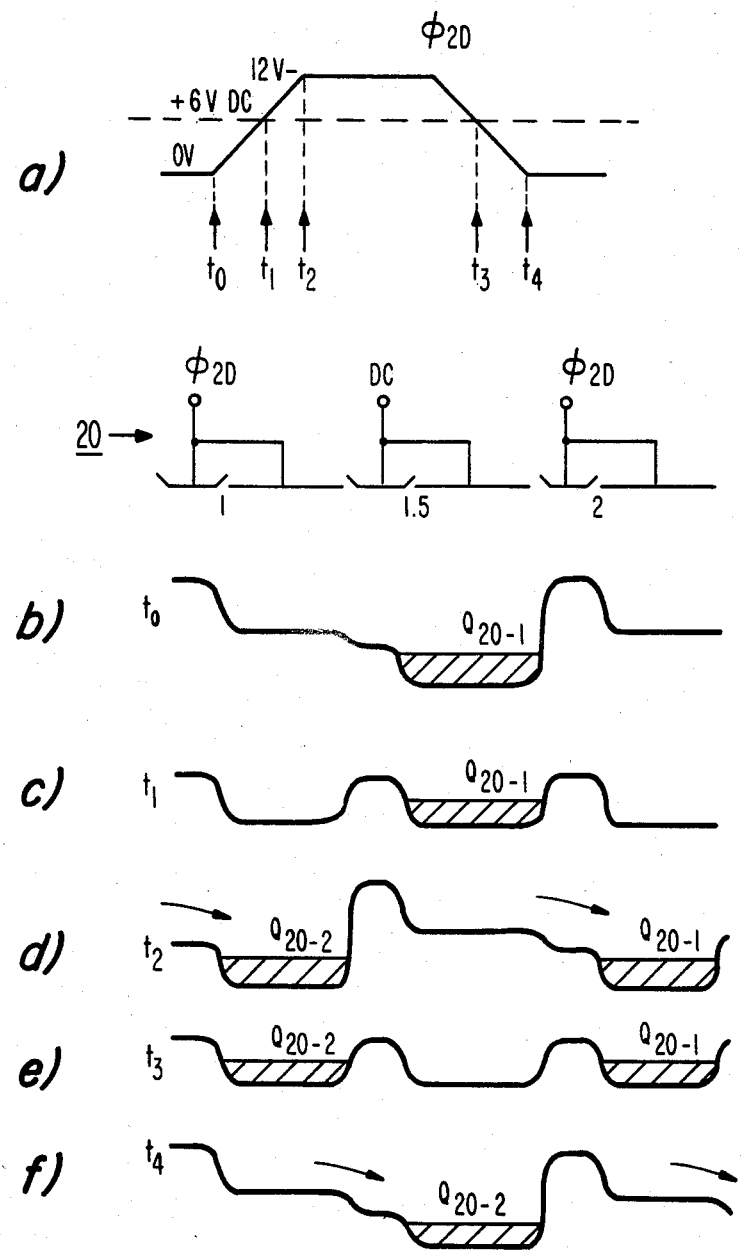

Uniphase clocking will next be described with reference to the uniphase portion of delay line 20 reproduced in FIG. 4. The $\emptyset_{2D}$ uniphase clock is applied to gates 1 and 2. A DC voltage (e.g., 6 volts) is applied to gate 1.5. The potential difference between the minimum and maximum DC levels of the $\emptyset_{2D}$ clock and the 6 volt DC voltage applied to gate 1.5 is equal to the minimum potential (6 volts) required for satisfactory charge propagation. Thus, charge packets within delay line 20 ($Q_{20}$) propagate through delay line 20 as illustrated in FIGS. 4b through 4f at various times $t_0$ through $t_4$ indicated in FIG. 4a. At time $t_0$ the DC level of the $\emptyset_{2D}$ clock pulse is at 0 volts, creating relatively shallow potential wells under gates 1 and 2. Thus, a first charge packet representative of a sample of the composite video signals, $Q_{20-1}$, is located at the deeper potential well under the storage electrode of gate 1.5, since it has a DC voltage of 6 volts applied, creating a voltage differential between its adjacent gates which is equal to the minimum potential differential required for efficient charge transfer (i.e., 6 volts). This is illustrated in FIG. 4b.

FIG. 4c illustrates the potential well diagram at time $t_1$, when the $\emptyset_{2D}$ clock is at 6 volts. At this time the DC potential applied to each of gates 1, 1.5 and 2 are all the same and the potential wells formed under their respective transfer and storage electrodes are of equal depth. Thus, the charge $Q_{20-1}$ does not propagate. FIG. 4d illustrates the potential well diagram at time $t_2$, when the $\emptyset_{2D}$ clock is at 12 volts. At this time, the deeper potential wells are those located under the clocked gates 1 and 2, while the potential wells located under gate 1.5 are more shallow. Thus, the next charge packet of the composite video signal, $Q_{20-2}$, enters from the left to be under gate 1 and charge $Q_{20-1}$ propagates one stage to the right (i.e., later in time) and resides under gate 2. At time $t_3$ the corresponding potential well diagram, FIG. 4e, is the same as FIG. 4c, since the voltage levels applied to all the gates are of equal amplitude (i.e., 6 volts). Similarly, at time $t_4$, the potential well diagram FIG. 4f is the same as FIG. 4b since now the clocked gates have 0 volts applied to them and the deeper potential wells are located under the electrodes of the DC gate, 1.5. Thus, the second charge $Q_{20-2}$ propagates one stage to the right and resides under gate 1.5. Charge $Q_{20-1}$ also propagates one stage to the right, where it additively combines with the charge from delay line 18, as described later.

The clocking of the charges within delay line 22 is the same as that described above with respect to delay line 20. However, the DC voltage in the uniphase portion of line 22, at gate 1.5 is applied via reset switch 32 and floating electrode 31, to be described more fully later.

Delay line 18, as previously noted, is biphase clocked for gates 0 through 682.5 setting up a 1H relative delay between delay lines 18 and 20, 22. Gate 683 has a $\overline{\emptyset}_{2D}$ clock applied to it and the gate between gates 682.5 and 683 has a DC voltage (6 volts) applied to it. Since at a time when the $\emptyset_{2D}$ clock is at 0 volts the $\overline{\emptyset}_{2D}$ clock is at 12 volts, a shallow potential well is developed under gate 682.5, an intermediate depth potential well is developed under the adjacent DC gate and deeper potential well is developed under gate 683. As a result, charge propagates from gate 682.5 directly across the DC gate (as indicated by an arrow) to gate 683. This type of charge transfer "skews" the signal processing timing with respect to delay line 22. This skewing helps set up the proper charge transfer in delay lines 18 and 22 for enabling sensing circuit 30 to perform a subtractive signal combination.

Sensing circuit 30 applies the uniphase DC voltage (6 volts) to gate 1.5 of delay line 22 and gate 683.5 of delay line 18. Specifically, floating electrode 31 is connected to the gate electrode of source follower NMOS transistor 33. Source follower 33 has its drain electrode coupled to a source of operating potential (+12 volts) and its source electrode coupled to amplifier 27 and to ground via a constant current source (i). Reset switch NMOS transistor 32 has a gate electrode coupled to receive the $\emptyset_{2D}$ clock signal, its source electrode coupled to a source of operating potential (+6 volts) and its drain electrode coupled to floating electrode 31. Illustratively, the turn-on threshold ($V_T$) for NMOS transistor 32 is 1.2 volts. Thus, when the positive-going portions of the $\emptyset_{2D}$ clock signal exceed the source voltage by 1.2 volts i.e., (it reaches +7.2 volts) transistor 32 is conductive and electrode 31 is clamped to +6 volts DC. When the DC level of the $\emptyset_{2D}$ clock signal falls below +7.2 volts, it becomes non-conductive and electrode 31 is not clamped. Source follower 33 DC isolates electrode 31 so that when electrode 31 is not clamped, it floats at +6 volts and any voltage variations sensed by electrode 31 due to charge packets transferring underneath are applied via the source electrode of source follower 32 to amplifier 27. Thus, except for a small DC voltage variation caused by the charge packets passing underneath gates 1.5 and 683.5, the DC voltage at electrode 31 acts as the uniphase constant DC voltage.

It is required that reset switch 32 finish unclamping electrode 31 when its gate potential (Vg) equals the uniphase clock voltage $V_{DC}$) in order that electrode 31 sense the subtraction of the 1H relatively delayed signals. That is, transistor 32 must be off when $Vg=V_{DC}$. If the source electrode of reset switch transistor 32 is coupled to an operating potential $V_{RS}$, for an N channel arrangement, $V_T$ must be less than $V_{DC}-V_{RS}$ and for a P channel arrangement $V_T$ must be greater than $V_{DC}-V_{RS}$ for proper operation.

As shown in FIG. 2, in the vicinity of electrode 31, delay line 18 is uniphase clocked with the $\overline{\phi}_{2D}$ clock signal and delay line 22 is uniphase clocked with the $\phi_{2D}$ clock signal. This opposite phase uniphase clocking allows electrode 31 to sense the subtractive combination of the signals within delay lines 18 and 22 as will now be described with reference to FIG. 5.

Figure 5:
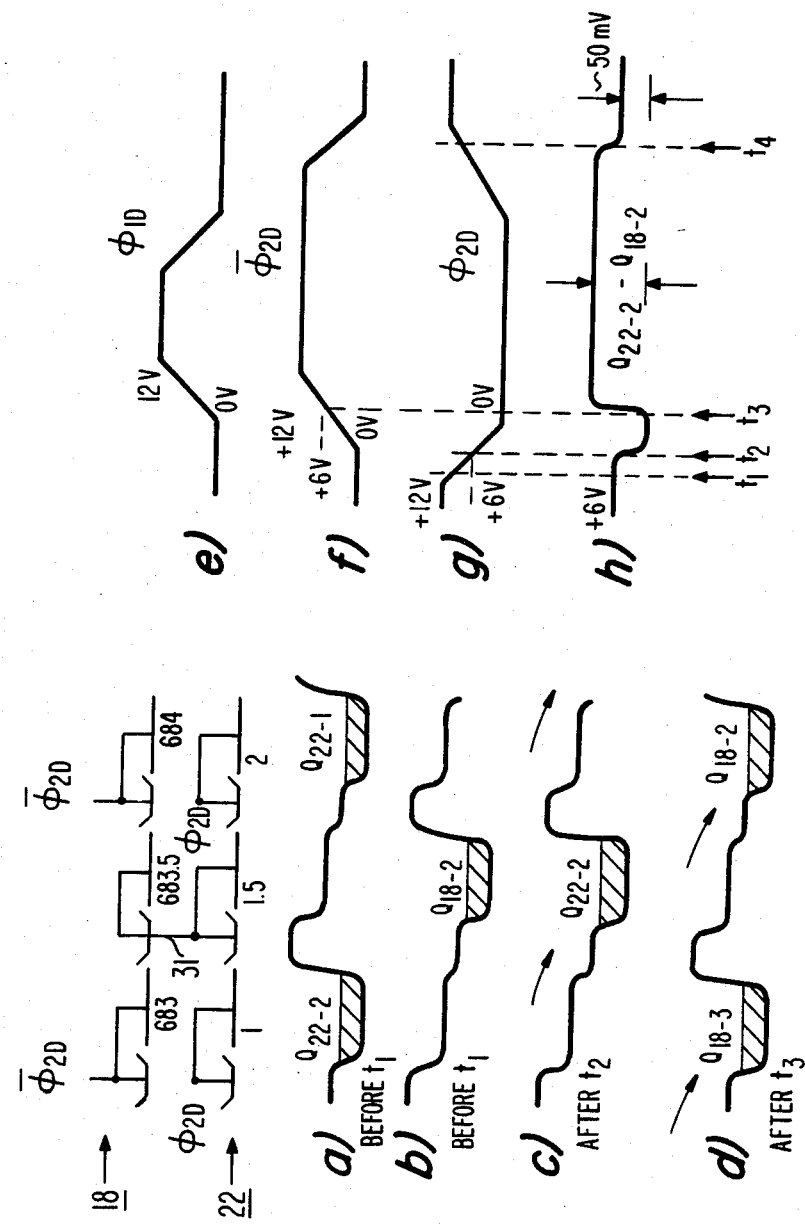

In FIG. 5, delay lines 18 and 22 in the vicinity of floating electrode 31 are reproduced and potential well diagrams a, b, c and d are shown thereunder. Waveforms e, f and g show in greater detail $\phi_{1D}$, $\phi_{2D}$ and $\overline{\phi}_{2D}$ clock signals and waveform h illustrates the DC voltage variations sensed by floating electrode 31.

Before time $t_1$, indicated in FIG. 5g the amplitude level of the $\phi_{2D}$ clock applied to reset switch 32 is above the DC turn on level (7.2 volts) for the NMOS transistor of reset switch 32, causing switch 32 to clamp electrode 31 to 6 volts. Furthermore, before time $t_1$, when the amplitude level of the $\phi_{2D}$ clock signal is greater than 6 volts (i.e., 12 volts), for delay line 22 a deeper potential well is formed under gates 1 and 2 than under gate 1.5 (which has 6 volts applied to it from floating electrode 31). This condition is illustrated in FIG. 5a, showing first and second charge packets $Q_{22-1}$ and $Q_{22-2}$ residing under gates succeeding and preceding floating gate 1.5, i.e., gates 2 and 1, respectively. Additionally, before time $t_1$ the amplitude level of the $\overline{\phi}_{2D}$ clock signal is less than 6 volts (i.e., 0 volts) causing for delay line 18 shallow potential wells under gates 683 and 684 and deeper potential wells under gates 683.5, which has 6 volts applied to it from floating electrode 31. This condition is illustrated in FIG. 5b. Due to the previously described "skewed" timing between delay lines 18 and 22, a first charge packet $Q_{18-1}$, corresponding to a charge packet having a 1H relative delay from $Q_{22-1}$, resides under gate 684.5 (of FIG. 2) and a second charge packet $Q_{18-2}$, corresponding to a charge packet having a 1H relative delay from $Q_{22-2}$, resides under floating gate 683.5.

Beginning at time $t_2$ indicated in FIG. 5g, the amplitude level of the $\phi_{2D}$ clock signal becomes less than 6 volts, causing for delay line 22 progressively shallower potential wells under gates 1 and 2 than under gate 1.5 (which has 6 volts applied to it from floating electrode 31). The net result is illustrated in FIG. 5c, in which charge $Q_{22-2}$ has propagated one stage to the right and resides under floating gate 1.5. The effect of charge $Q_{22-2}$ in this position, is to slightly reduce the DC voltage level at floating electrode 31, as illustrated in FIG. 5h. Note, that since the amount of reduction in DC voltage level is in the order of millivolts, the vertical scale of FIG. 5h is expanded to clearly show this effect.

Beginning at time $t_3$ the amplitude of the $\overline{\phi}_{2D}$ clock signal becomes greater than 6 volts, creating progressively deeper potential wells under gates 683 and 684 of delay line 18 than under gate 683.5. The net result is illustrated in FIG. 5d in which charge packet $Q_{18-2}$ has propagated one stage to the right and resides under the deeper potential well of gate 684 which succeeds floating gate 683.5 and a third charge packet $Q_{18-3}$ resides under gate 683 which precedes floating gate 683.5. The effect on electrode 31 of the removal of charge $Q_{18-2}$ from under floating gate 683.5 is to slightly raise the DC voltage level sensed by floating electrode 31. This is illustrated in FIG. 5h for the condition where the charge packet in delay line 18 ($Q_{18-2}$) was of a greater magnitude than the corresponding charge packet within delay line 22 ($Q_{22-2}$). The change in voltage level at floating electrode 31 represents (in absolute value) the subtractive combination between the corresponding charge packets of delay lines 18 and 22 (i.e., $Q_{22-2}-Q_{18-2}$). Note, this subtractive combination occurs at a time when charge is being transferred into gate 684 of delay line 18 and gate 1.5 of delay line 22, thus establishing a 682.5 gate differential between the corresponding charges of each line, which, as previously noted, results in precisely a 1H differential delay. Consequently, the voltage variations sensed by electrode 31 represent the combed chrominance signal, which is applied via source follower 33 to the signal input of sampling amplifier 34.

In accordance with the principle of the present invention, an amplitude transition of the same clock signal $\phi_{2D}$, is used to perform two functions which must be properly sequenced to allow efficient operation of the floating gate subtractor. Firstly, the $\phi_{2D}$ clock signal is used to unclamp floating electrode 31 at time $t_1$, when its amplitude falls below the previously noted 7.2 volt turn-on threshold of NMOS reset transistor 32. Secondly, the $\phi_{2D}$ clock signal is used to initiate charge transfer in under electrode 31 within delay line 22 at time $t_2$, when its amplitude falls below 6 volts, causing progressively shallower potential wells under gates 1 and 2 than under gate 1.5. Since the falling edge of the $\phi_{2D}$ clock signal has an amplitude excursion which includes the necessary DC voltage levels necessary to perform these functions, it synchronizes or "self-times" these functions with respect to each other. Because of this self-timing, an additional clocking signal customarily referred to as $\phi_{reset}$ is not required for periodically clamping the floating electrode.

Furthermore, since delay line 18 is clocked by an inverted $\phi_{2D}$ ($\overline{\phi}_{2D}$), the rising edge of its clock signal necessarily occurs a short time after the falling edge of the $\phi_{2D}$ clock signal of delay line 22 (as determined by the time delay presented by the $\phi_{2D}$ signal inverter 76 of FIG. 1a). Thus, since the $\overline{\phi}_{2D}$ clock signal increases above 6 volts, initiating charge transfer out from under electrode 31 at time $t_3$ a short time after the $\phi_{2D}$ clock signal falls below 6 volts, which initiates charge transfer in under electrode 31 at time $t_2$, the time delay between charge transfers under electrode 31 is also minimized. Consequently, the time duration which can be used for sampling the subtractive combination is maximized. This maximum sampling time period is the time duration between time $t_2$ and a time $t_4$, shown in waveform 5h. At time $t_4$ the amplitude of the $\phi_{2D}$ clock signal has increased to 7.2 volts, thus reaching the turn-on voltage for reset switch 32 which again clamps electrode 31 to 6 volts DC. The $\phi_{1D}$ clock signal (FIG. 5e) serves as an appropriate sampling signal for sampling amplifiers 27 and 34 of FIG. 1.

As previously noted with reference to FIG. 5b, charge $Q_{18-1}$ had passed to gate 684.5 (of FIG. 2) by time $t_1$. This charge bypasses the DC gate shown in FIG. 2 between gates 684 and 684.5 for the same reason previously discussed with respect to the DC gate between gates 682.5 and 683.

With the above in mind, referring to FIGS. 2 and 5, during the next uniphase clock cycle, when the $\phi_{2D}$ clock which is applied in common to gates 2 and 684.5 of delay lines 20 and 18 is at 0 volts, charge $Q_{18-1}$ advances to gate 685, and the corresponding charge, $Q_{20-1}$, also advances to gate 685 (due to the previously noted merger of delay lines 18 and 20).

Note, the gate differential between the corresponding charge packets (i.e., $Q_{18-1}$ and $Q_{20-1}$) of delay lines 18 and 20 at the point of charge combination is 682.5 (i.e., 685 less 2.5). Since 1H relatively delayed charges from delay line 18 and 22 both arrive at gate 685 at the same time, additive combination results, generating the previously mentioned combed luminance signal.

The combined charges representative of the combed luminance signal propagate in a uniphase manner within delay line 18 and under gate 686. Sensing circuit 23, including floating electrode 24 coupled to gate 686, senses the combed luminance signal passing thereunder and applies the combed luminance signal via the output of source follower 26 to the input of sample and hold amplifier 27.

The time delay D between the sensed combed chrominance signal and sensed combed luminance signal as shown in FIG. 2 corresponds to 2 stages (686 less 684). A lesser or greater delay can be provided between the sensed signals by coupling floating electrode 24 to a gate located earlier or later in time along delay line 18.

Although the invention has been disclosed in terms of particular embodiments, further embodiments can be devised by those skilled in the art without departing from the scope of the invention.

For example, the frequency of the clock signals is not limited to 10.7 MHz and can be, e.g., at four times the color subcarrier frequency, i.e., 14.3 MHz for an NTSC signal. In this instance, a differential delay provided by 910 delay stages instead of $682\frac{1}{2}$ delay stages would be required.

What is claimed is:

1. Apparatus for subtracting a first signal from a second signal, comprising:
   first and second charge transfer channels formed on a substrate;
   a plurality of gates overlying said first channel for storing and transferring charge packets representative of said first signal therein;
   a plurality of gates overlying said second channel for storing and transferring charge packets representative of said second signal therein;
   means for applying a first clock signal to gates overlying said first channel, the storage of a charge packet under a clocked gate being initiated when said first clock signal transgresses a first threshold level and transfer of a charge packet out from beneath a clocked gate being initiated when said first clock signal transgresses a second threshold level;
   means for applying a second clock signal opposite in phase to said first clock signal to gates overlying said second channel, the storage of a charge packet under a clocked gate being initiated when said second clock signal transgresses said first threshold level and transfer of a charge packet out from beneath a clocked gate being initiated when said second clock signal transgresses said second threshold level;
   a floating gate overlying both said first and second channels, between preceding and succeeding gates of each of said channels;
   means for periodically clamping and unclamping said floating gate to a reference potential when the level of a clamp signal transgresses a third threshold level in first and second directions, respectively; and
   means for applying said second clock signal to said clamp means as said clamp signal, said second clock signal including an amplitude excursion which sequentially transgreses said third threshold level in said second direction for unclamping said floating gate and then transgresses said second threshold level for initiating a transfer of a charge packet in said second channel to transfer under said floating electrode from said preceding gate of said second channel;
   said first clock signal including an amplitude excursion which transgresses said first threshold level at a time after said second clock signal transgresses said second threshold level, for initiating storage of a charge packet in said succeeding gate of said first channel;
   whereby said floating electrode senses a subtractive combination of said charge packet of said second channel transferred under said floating electrode and said charge packet of said first channel transferred to said succeeding gate.

2. The apparatus recited in claim 1 further including:
   a DC gate preceding said preceding gate of one of said channels; and
   means for applying a potential substantially equal to said reference potential to said DC gate.

3. The apparatus recited in claims 1 or 2 wherein:
   said means for clamping comprises a field effect transistor, including first and second electrodes defining the ends of a conduction channel of the same conductivity type as said first and second charge transfer channels and a gate electrode for controlling the conduction of said conduction channel, means for coupling said reference potential to said first electrode, means for coupling said second electrode to said floating gate, and means for coupling said second clock signal to said gate electrode, said field effect transistor having a conduction threshold selected so that its conduction channel is rendered non-conductive when said second clock signal transgresses said third threshold level in said second direction.

4. The apparatus recited in claim 3 wherein;
   said first and second threshold levels both differ from said third threshold level by an amount corresponding to said conduction threshold of said field effect transistor.

* * * * *

UNITED STATES PATENT AND TRADEMARK OFFICE
CERTIFICATE OF CORRECTION

PATENT NO. : 4,509,181
DATED : April 2, 1985
INVENTOR(S) : Donald Jon Sauer

It is certified that error appears in the above-identified patent and that said Letters Patent is hereby corrected as shown below:

In the Title: "Substraction" should be --Subtraction--.

Column 1, line 2, "Substraction" should be --Subtraction--.

Column 5, line 19, "ame" should be --same--.

Signed and Sealed this

Twenty-seventh Day of August 1985

[SEAL]

Attest:

DONALD J. QUIGG

Attesting Officer    Acting Commissioner of Patents and Trademarks